United States Patent [19]

Yamanaka et al.

[11] Patent Number: 4,710,479

[45] Date of Patent: Dec. 1, 1987

[54] SEALING GLASS COMPOSITION WITH LEAD CALCIUM TITANATE FILLER

[75] Inventors: Toshio Yamanaka; Fumio Yamaguchi, both of Shiga, Japan

[73] Assignee: Nippon Electric Glass Company, Limited, Otsu, Japan

[21] Appl. No.: 36,072

[22] Filed: Apr. 9, 1987

[30] Foreign Application Priority Data

Apr. 16, 1986 [JP] Japan .................................. 61-87542

[51] Int. Cl.[4] .......................... C03C 8/14; C03C 8/24; C03C 14/00; C03C 3/064
[52] U.S. Cl. ....................................... 501/15; 501/17; 501/32; 501/75; 501/76
[58] Field of Search ....................... 501/15, 17, 32, 75, 501/76

[56] References Cited

U.S. PATENT DOCUMENTS

| | | | |
|---|---|---|---|
| 4,115,132 | 9/1978 | Suzuki et al. | 501/15 |
| 4,186,023 | 1/1980 | Dumesnil et al. | 501/15 |
| 4,365,021 | 12/1982 | Pirooz | 501/15 |
| 4,405,722 | 9/1983 | Kokuba et al. | 501/15 |
| 4,415,898 | 5/1985 | Davis et al. | 501/15 |

Primary Examiner—Mark L. Bell
Attorney, Agent, or Firm—Kurt Kelman

[57] ABSTRACT

A sealing glass composition suitable for sealing members in semiconductor devices at a temperature below about 450° C. for a short time and a comparatively low thermal expansion coefficient of about $33-48 \times 10^{-7}$/°C. matching with semiconductors. The sealing glass composition comprises 50–80 vol % solder glass powder and 20–50 vol % filler powder of lead calcium titanate represented by $(Pb_{1-m}Ca_m)TiO_3$ where $0 < m \leq 0.4$.

3 Claims, 1 Drawing Figure

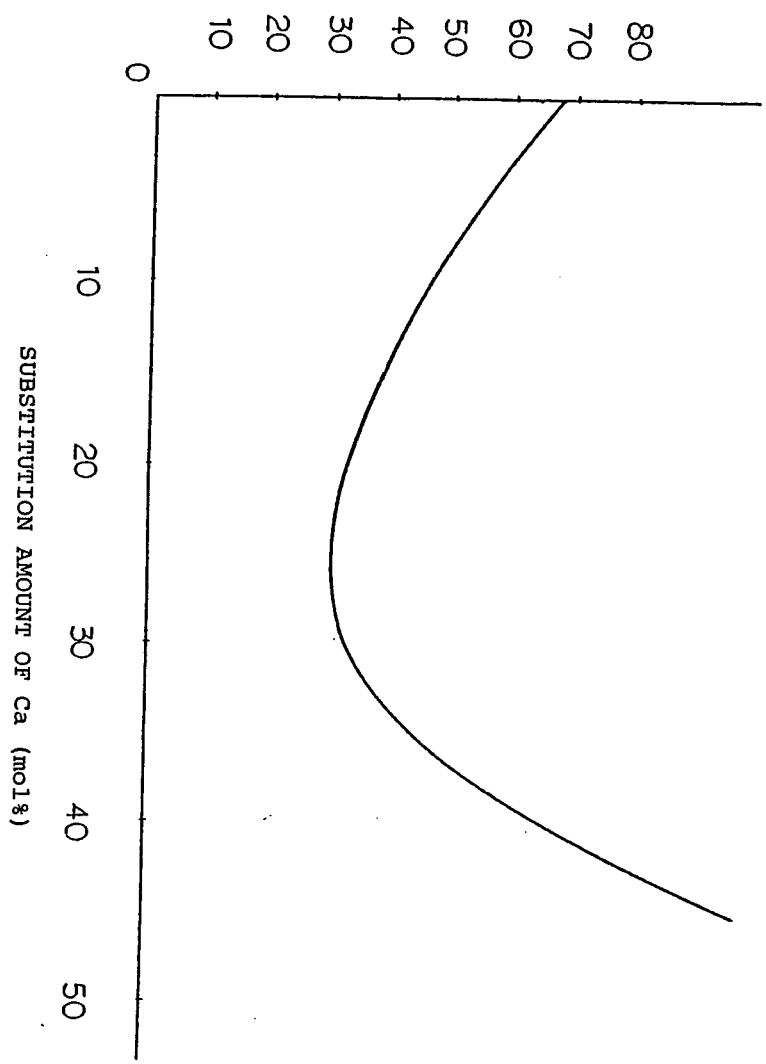

SEALING GLASS COMPOSITION WITH LEAD CALCIUM TITANATE FILLER

BACKGROUND OF THE INVENTION

(1) Field of the Invention

This invention relates to a sealing glass composition for hermetically sealing two members, and, in particular, to such a composition for use in electronic parts production.

(2) Description of the Prior Art

In production of electronic parts such as semiconductor devices, fluorescent character display tubes, and others, sealing glass compositions have been used for sealing and/or bonding a plurality of members.

Generally speaking, the sealing glass composition is a powdery mixture comprising solder glass powder of a low melting temperature and refractory filler powder. As the solder glass, $PbO$-$B_2O_3$ glass has been used which consists essentially of 40-90 wt % PbO and 8-15 wt % $B_2O_3$.

Among various refractory oxides of a low thermal expansion used for the filler, lead titanate ($PbTiO_3$) is conveniently used, especially for semiconductor devices, because it contains no alkali element. The use of lead titanate makes the thermal expansion coefficient of the sealing glass composition low and increases the flowability of the glass composition.

Japanese patent application laid open with publication No. 49-89713 discloses a sealing glass composition comprising a solder glass mixed with $PbO$-$TiO_2$ crystal powder having a specific surface diameter of about 10 $\mu m$ or less. However, the sealing glass composition has a high thermal expansion coefficient of $54.5 \times 10^{-7}/°C.$, so that it is useless for bonding a silicon semiconductor chip (having a thermal expansion coefficient of about $32-35 \times 10^{-7}/°C.$) and an alumina ceramic (having a thermal coefficient of about $70 \times 10^{-7}/°C.$)

In order to lower the thermal expansion of the sealing glass composition, it is known in the art to use an increased amount of lead titanate or to use lead titanate powder of an increased particle size.

Another sealing glass composition comprising solder glass powder and fillers of lead titanate, zirconium silicate, and tin materials is disclosed in Japanese patent application laid open with publication No. 58-151374. The sealing composition has a sufficiently low thermal expansion coefficient and is useful for sealing semiconductor devices. However, the sealing glass composition has disadvantages because the lead titanate powder has an averaged particle size of about 15 $\mu m$ or more. It is difficult to deposit, by screen printing, a paste of the glass composition dissolved in a vehicle onto members to be bonded. Further, after sealing, microcracks are apt to cause in glass phase around the lead titanate crystals.

SUMMARY OF THE INVENTION

It is an object of the present invention to provide a glass sealing composition using $PbO$-$TiO_2$ crystals for the filler wherein a lower thermal expansion coefficient can be realized and microcrack is not caused even if the filler has a small average particle size of, for example, 15 $\mu m$ or less and is used by a small amount.

The present invention is directed to a sealing glass composition comprising solder glass powder of a low melting point and filler powder. According to the present invention, the filler consists essentially of lead calcium titanate represented by the following chemical formula;

$$(Pb_{1-m}Ca_m)TiO_3$$

where $0 < m \leq 0.4$.

The amount of the filler is preferably about 20-50% by volume of the total amount of the sealing glass composition.

The filler powder preferably has an average particle size of about 15 $\mu m$ or less.

BRIEF DESCRIPTION OF THE DRAWINGS

A single FIGURE is a diagrammatic graphic view illustrating a relation of a thermal expansion coefficient of the sealing glass composition of the present invention and calcium amount substituted for lead in lead titanate ($PbTiO_3$) used in the composition.

DESCRIPION OF THE INVENTION

The present invention attempts to use, as the filler, an oxide powder having lead, titanium, and calcium substituting for lead in lead titanate ($PbTiO_3$). The substitution amount of calcium for lead is 40 mol % at maximum.

When the substitution amount exceeds 40 mol %, a thermal expansion coefficient of a resultant sealing glass composition is not lower than that of the known sealing glass composition using $PbTiO_3$ as the filler.

A single FIGURE shows a relation between the various substitution amounts of calcium for lead of $PbTiO_3$ as the filler and a thermal expansion coefficient of resultant sealing glass compositions. The filler was prepared as powder having an average particle size of 5 $\mu m$. The filler of 40 vol % was mixed with a solder glass powder of 60 vol %. The solder glass powder consists, by weight, of 85.3% PbO, 12.7% $B_2O_3$, 1.0% $SiO_2$, and 1.0% $Al_2O_3$. The FIGURE teaches that use of filler having the calcium substitution amount of 40 mol % or less make a thermal expansion coefficient of a resultant sealing composition lower than a composition using $PbTiO_3$ as the filler.

As the solder glass in the sealing glass composition of the present invention, $PbO$-$B_2O_3$ glass as described above can be used.

In the sealing glass composition of the present invention, at least one of $\beta$-eucryptite, cordierite, willemite, zinc material, $SnO_2$ solid solution, and zircon can be optionally used for the filler in addition of the lead calcium titanate. The zinc material comprises 68-75 wt % ZnO, 23-28 wt % $SiO_2$, and 0.1-8 wt % $Al_2O_3$.

EXAMPLES

Table 1 shows samples of the filler used in glass compositions according to the present invention.

TABLE 1

| | |
|---|---|
| A | $Pb_{0.85} Ca_{0.15} Ti O_3$ |
| B | $Pb_{0.80} Ca_{0.20} Ti O_3$ |
| C | $Pb_{0.75} Ca_{0.25} Ti O_3$ |
| D | $Pb_{0.70} Ca_{0.30} Ti O_3$ |

The filler samples of Table 1 were prepared using raw materials of litharge, calcium carbonate, and titanium oxide. The raw materials were blended in proportion of each sample shown in Table 1 and were dry mixed. Then, the mixture was roasted at 1,000° C. for 4 hours and a roasted body was milled to a powder. The powder was pressed into a compact body under a pressing force of about 1 ton.f/cm². The compact body was heated to 1,250° C. by a rate of 200° C./hour and was sintered by being maintained at the temperature for three hours. The sintered body was milled and filtrated by a screen of 350 mesh to obtain powder of an average particle size of about 5 μm.

Table 2 shows glass samples used in sealing composition according to the present invention.

TABLE 2

| Ingredients | Glass A | Glass B | Glass C | Glass D |
|---|---|---|---|---|
| PbO (wt %) | 82.6 | 85.3 | 84.3 | 81.2 |
| $B_2O_3$ (wt %) | 11.5 | 12,7 | 11.9 | 12.3 |
| $SiO_2$ (wt %) | 2.9 | 1.0 | 1.0 | 1.0 |
| $Al_2O_3$ (wt %) | 3.0 | 1.0 | — | — |
| ZnO (wt %) | — | — | 2.8 | 4.0 |
| Transition Point (°C.) | 320 | 310 | 300 | 280 |
| Deformation Point (°C.) | 340 | 330 | 325 | 300 |
| Thermal Expansion Coefficient ($\times 10^{-7}$/°C.) (30–250° C.) | 100 | 110 | 110 | 120 |

The sample glasses listed in Table 2 were produced by using red lead, boric acid, silica sand, alumina, and zinc white as materials for respective ingredients of the glasses. Those materials were weighed and mixed according to weight percent indicated in Table 2. The batch for each of sample glass was inserted in a platinum crucible and was melted at 800° C. for one hour in an electric furnace. The molten glass was formed into a thin glass plate. The glass plate was milled in a ball mill and then screened through a screen of 200 mesh.

Each sample glass powder of Table 2 and each sample filler of Table 1 were weighed and mixed with each other according to weight percent of example compositions listed in Table 3.

Each example composition of Nos. 1–7 in Table 3 was mixed with a suitable vehicle to form a paste. An example of a vehicle used is toluene. The paste was applied, by a usual method such as screen printing, onto surfaces of bodies to be sealed and fired to seal them.

TABLE 3

| | | Example 1 | Example 2 | Example 3 | Example 4 |
|---|---|---|---|---|---|
| Filler (vol %) | A | | | | |
| | B | | | | 40 |
| | C | 30 | 40 | | |
| | D | | | 40 | |
| Glass (vol %) | A | 70 | | | |
| | B | | 60 | 60 | 60 |
| Thermal Expansion Coefficient ($\times 10^{-7}$/°C.) (30–250° C.) | | 48 | 32 | 33 | 33 |
| Sealing Temperature (°C.) | | 450 | 430 | 430 | 430 |

| | | Example 5 | Example 6 | Example 7 |
|---|---|---|---|---|
| Filler (vol %) | A | 40 | | |
| | B | | 40 | |
| | C | | | 40 |
| Glass (vol %) | B | 60 | | |
| | C | | 60 | 60 |
| Thermal Expansion Coefficient ($\times 10^{-7}$/°C.) (30–250° C.) | | 39 | 33 | 33 |
| Sealing Temperature (°C.) | | 430 | 425 | 425 |

| | | Example 8 | Example 9 | Example 10 | Example 11 |
|---|---|---|---|---|---|
| Filler (vol %) | C | 38 | 10 | 35 | 5 |
| | zircon | 4 | | | |
| | β-eucryptite | | 40 | | |
| | tin solid solution | | | 10 | 6 |
| | willemite | | | | 29 |
| Glass (vol %) | B | 58 | | | |
| | C | | 50 | | |
| | D | | | 55 | 60 |
| Thermal Expansion Coefficient ($\times 10^{-7}$/°C.) (30–250° C.) | | 41 | 47 | 38 | 68 |
| Sealing Temperature (°C.) | | 450 | 450 | 410 | 410 |

It was confirmed that the sealing temperature was low and about 430°–450° C. as shown in Table 3. Further, a comparatively low thermal expansion coefficient was realized and was useful for sealing silicon semiconductor devices.

What is claimed is:

1. In a sealing glass composition, as used for sealing members in electronic parts, comprising solder glass powder of a low melting temperature and low expansion coefficient filler powder, the improvement wherein said filler consists essentially of a lead calcium titanate represented by the following chemical formula;

$$(Pb_{1-m}Ca_m)TiO_3$$

where $0 < m \leq 0.40$.

2. A sealing glass composition as claimed in claim 1, wherein said filler is 20–50 vol % of the total amount of said composition.

3. A sealing glass composition as claimed in claim 1, wherein said filler powder has an average particle size of about 15 μm or less.

* * * * *